United States Patent
Liu et al.

(10) Patent No.: US 11,726,158 B2
(45) Date of Patent: Aug. 15, 2023

(54) 3D FLOW COMPENSATED INTERLEAVED EPI WITH A CENTRIC REORDERING SCHEME FOR FAST HIGH-RESOLUTION SUSCEPTIBILITY-WEIGHTED IMAGING

(71) Applicant: Siemens Healthcare GmbH, Erlangen (DE)

(72) Inventors: Wei Liu, Shenzhen (CN); Kun Zhou, Shenzhen (CN); Qiong Zhang, Shenzhen (CN)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 17/383,563

(22) Filed: Jul. 23, 2021

(65) Prior Publication Data
US 2022/0026515 A1    Jan. 27, 2022

(30) Foreign Application Priority Data
Jul. 24, 2020  (CN) .......................... 202010721447.3

(51) Int. Cl.
*G01V 3/00* (2006.01)
*G01R 33/561* (2006.01)
*G01R 33/565* (2006.01)

(52) U.S. Cl.
CPC ... *G01R 33/5616* (2013.01); *G01R 33/56536* (2013.01); *G01R 33/56554* (2013.01)

(58) Field of Classification Search
CPC ...... G01R 33/5659; G01R 33/36; A61B 5/055
USPC ........................................................ 324/309
See application file for complete search history.

(56) References Cited

FOREIGN PATENT DOCUMENTS

CN    105232046 A  *  1/2016
CN    108567422 A  *  9/2018   ........... A61B 5/0263

* cited by examiner

*Primary Examiner* — Walter L Lindsay, Jr.
*Assistant Examiner* — Frederick Wenderoth
(74) *Attorney, Agent, or Firm* — Banner & Witcoff Ltd.

(57) ABSTRACT

A method and apparatus for susceptibility-weighted imaging, and a magnetic resonance imaging system. The method includes, in planar echo imaging of a plurality of excitations, performing flow compensation in directions of layered encoding, phase encoding, and frequency encoding for echoes of each excitation; after determination of excitation each time, when a linear reordering mode is adopted, for excitation each time, collecting each echo towards space k in a positive direction or a negative direction from the central echo of the plurality of echoes, and collecting echoes of the current excitation in a direction opposite to a direction of collecting echoes of the previous excitation; and subjecting the collected echoes to susceptibility-weighted imaging. An aspect of the present disclosure allows a reduction of flow artifacts in an image created by susceptibility-weighted imaging based on a planar echo sequence.

13 Claims, 5 Drawing Sheets

3D FLOW COMPENSATED INTERLEAVED EPI WITH A CENTRIC REORDERING SCHEME FOR FAST HIGH-RESOLUTION SUSCEPTIBILITY-WEIGHTED IMAGING

TECHNICAL FIELD

The present disclosure relates to the technical field of magnetic resonance imaging (MRI), and in particular to a method and an apparatus for susceptibility-weighted imaging, and an MRI system.

BACKGROUND

In MRI, radio frequency (RF) pulses with a specific frequency are applied to the human body in a magnetostatic field so that hydrogen protons in the human body are excited to allow magnetic resonance (MR); after the application of pulses has stopped, MR signals are generated during the relaxation of the protons, received, and then subjected to space encoding, image reconstruction, and other treatment processes to generate an MR image.

In the imaging process, after RF excitation, first, layer selection is completed by a gradient in the Z direction; in other words, a layer for imaging is selected; then, a gradient magnetic field in the Y direction is opened so that precession speeds of magnetic moments in different Y positions will also vary, and then the Y gradient is closed; thus, the precession speeds of magnetic moments in each position are restored to become the same, but phase deviations in different Y positions vary due to the previous differences in procession speed, which is a process known as phase encoding; next, a gradient in the X direction is opened, with different precession speeds of magnetic moments in different X positions, which is a process known as frequency encoding. Thus, by phase encoding and frequency encoding, each position of a 2D image is determinable; a signal collected by a receiving coil is a signal of space k, which is subjected to Fourier transformation to obtain an image; then, a new round of layer selection is completed in the Z direction, and the above-described process is repeated to obtain a 3D MRI image.

Different RFs may be formed by a combination of 90° RF and 180° RF. Common MRI RF techniques include spin-echo (SE) sequence, turbo spin-echo (TSE) sequence, gradient-echo (GRE) sequence, and Echo Planar Imaging (EPI). In GRE and EPI, gradient echoes are generated. Generation of a gradient echo means that, after one RF excitation, a gradient echo is generated by means of a forward and reverse switchover in the direction of reading a gradient field (namely, the X direction). In EPI, different from a common gradient echo, after one RF excitation, by means of consecutive forward and reverse switchovers between read gradient fields, one gradient echo is generated per switchover and therefore there exists an echo chain, similar to TSE.

In magnetic resonance imaging, after a static tissue has undergone layer selection gradients of the same magnitude but in opposite directions (namely, gradients in the Z direction), the obtained phase is cumulatively zero; in contrast, for a motor tissue moving along the direction of reading a gradient field (namely, the X direction), such as flowing blood and cerebrospinal fluid, the phase is cumulatively not zero; when the phase encoding gradient (namely, the gradient in the Y direction) is applied subsequently, a motor tissue that already has a phase will be encoded incorrectly and appear in another position, becoming a flow artifact.

Flow compensation (FC), also known as gradient moment nulling (GMN), is a technique for reducing or eliminating flow artifacts by using specially designed gradient fields. The FC technique supports a variety of gradient combination modes. By multiple transformations of forward and reverse gradient fields having different areas, phase deviations of fluids having various speeds will ultimately be brought close to zero, which allows elimination of motion artifacts. Generally, FC refers to, by the elimination of a first-order gradient moment, the offsetting of the impact exerted by uniform motion; the GMN mentioned herein also refers to a first-order moment compensation.

Susceptibility-weighted imaging (SWI) is an imaging technique with magnetic resonance contrast enhancement, in which, with a T2* weighted gradient echo sequence as the sequence basis, by means of phase information of collected MR signals, an enhanced image contrast is provided for tissues with differences in magnetic susceptibility. This technique has been widely used in evaluating ferruginous tissues and veins in various clinical environments.

In an existing scheme, an SWI image is obtained by full-flow compensation for a T2* weighted 3D-GRE sequence; with this method, full-flow compensation is performed for each echo; in other words, compensation is performed for each echo in the layer selection direction (namely, the Z direction), the phase encoding direction (namely, the Y direction), and the frequency encoding direction (namely, the X direction, also known as the direction of reading a gradient field), and therefore the scanning takes a longer time.

To improve the scanning efficiency, a 3D-interleaved Echo Planar Imaging (iEPI) technique has been proposed as a fast alternative scheme for 3D-GRE. In 3D-iEPI, a relatively small EPI echo chain length is used, and typical EPI-related artifacts (distortions and blurs) are limited; in addition, an image has gains in terms of both signal-to-noise ratio (SNR) and efficiency while maintaining a similar contrast of amplitude and phase image comparable to traditional 3D-GRE. However, compared with GRE, EPI adopts a more complicated flow compensation design. In GRE, one echo is collected per excitation; in contrast, with an EPI sequence, a plurality of echoes are collected per excitation, which makes it difficult to perform full-flow compensation in three directions during flow compensation, unless all the echoes having the same read gradient polarity in the frequency encoding direction are flow-compensated by means of flyback, but at the sacrifice of scanning efficiency.

Therefore, in order to fully utilize the scanning efficiency achievable in the GMN when the GMN is used for an EPI echo chain, a 3D-iEPI scheme based on linear reordering has been proposed. In this scheme, when the implementation of flow compensation with a layer selection gradient is the same as that of 3D-GRE, only the central echo of each excitation is flow-compensated in all the directions, namely, the layered encoding direction, the phase encoding direction, and the frequency encoding direction; then, flow-compensated echoes are collected by mean of linear reordering to realize fast SWI and improve the SNR. However, an analysis of SWI images generated using this scheme showed that the images still contained obvious vein flow contaminations.

SUMMARY

In view of the above-described background, an aspect of the present disclosure, in one aspect, proposes an SWI method and, in another aspect, proposes an SWI apparatus and an MRI system for reducing the impact of the flow effect on an SWI image based on a planar echo sequence.

Disclosed is a method for susceptibility-weighted imaging, comprising:

in planar echo imaging of a plurality of excitations, performing flow compensation in directions of layered encoding, phase encoding, and frequency encoding for echoes of each excitation;

determining a plurality of echoes to be collected for each excitation when a linear reordering mode is adopted, collecting each echo towards space k in a positive direction or a negative direction from the central echo of the plurality of echoes, and collecting echoes for the current excitation in a direction opposite to the direction of collecting echoes for the previous excitation;

performing susceptibility-weighted imaging of the collected echoes.

The collecting echoes for the current excitation in a direction opposite to the direction of collecting echoes for the previous excitation comprises:

when the direction of collecting echoes for the previous excitation is in a positive direction from the central echo to the space k until the collection is made equivalent to the last echo when collection is done by mean of linear reordering, then the direction of collecting echoes for the current excitation is: in a negative direction from the central echo to the space k until the collection is made equivalent to the first echo when collection is done by mean of linear reordering; or, when the direction of collecting echoes for the previous excitation is in a negative direction from the central echo to the space k until the collection is made equivalent to the first echo when collection is done by mean of linear reordering, then the direction of collecting echoes for the current excitation is: in a positive direction from the central echo to the space k until the collection is made equivalent to the last echo when collection is done by mean of linear reordering.

The collecting each echo towards the space k in a positive direction or a negative direction from the central echo of the plurality of echoes comprises:

collecting each echo towards the space k in a positive direction or a negative direction from the central echo of the plurality of echoes upon completion of transmission of layer selection encoding gradient pulses and phase encoding gradient pulses for the current excitation.

After the collecting each echo towards the space k in a positive direction or a negative direction from the central echo of the plurality of echoes and before performing susceptibility-weighted imaging of the collected echoes, the method further comprises:

superposing and then averaging the two central echoes of the $m^{th}$ and the $(m+1)^{th}$ collections and then using the obtained average data as the central echo of the $m^{th}$ and the $(m+1)^{th}$ collections, wherein $1 \leq m < M$, M being the total number of excitations of the current planar echo imaging.

The performing flow compensation in directions of layered encoding, phase encoding, and frequency encoding for echoes of each excitation comprises:

performing flow compensation in directions of layered encoding and phase encoding for a central echo of each excitation, the central echo being the central echo of a plurality of echoes to be collected when the linear reordering mode is adopted after each excitation;

performing flow compensation in the frequency encoding direction for the odd echoes of each excitation.

The performing flow compensation in directions of layered encoding and phase encoding for a central echo of each excitation comprises:

performing flow compensation in directions of layered encoding and phase encoding according to the following formulas:

$$M_{1,par} = M_{0,par} \Delta t_{par}$$

$$M_{1,phase} = M_{0,phaseprephase} \Delta t_p$$

wherein $M_{1,par}$ is the first-order moment at the central echo in the layered encoding direction, and $M_{1,phase}$ is the first-order moment at the central echo in the phase encoding direction; $M_{0,par}$ is the zero-order moment of the layered encoding gradient in the layered encoding direction, and $M_{0,phaseprephase}$ is the zero-order moment of the prephase gradient in the phase encoding direction, $M_{0,par}$ and $M_{0,phaseprephase}$ varying in different excitations; $\Delta t_{par}$ is the time from the center of the layered encoding gradient to the central echo in the layered encoding direction, and $\Delta t_p$ is the time from the center of the prephase gradient to the central echo in the phase encoding direction.

Disclosed is an apparatus for susceptibility-weighted imaging, comprising:

a flow compensation module (51) for, in planar echo imaging of a plurality of excitations, performing flow compensation in directions of layered encoding, phase encoding, and frequency encoding for echoes of each excitation;

an echo collection module (52) for, after determining a plurality of echoes to be collected after each excitation when the linear reordering mode is adopted, collecting each echo towards the space k in a positive direction or a negative direction from the central echo of the plurality of echoes, and collecting echoes for the current excitation in a direction opposite to the direction of collecting echoes for the previous excitation;

a weighted imaging module (53) for performing susceptibility-weighted imaging of the collected echoes.

The echo collection module (52) collecting echoes for the current excitation in the direction opposite to the direction of collecting echoes for the previous excitation comprises:

when a direction of collecting echoes for the previous excitation is in a positive direction from the central echo to the space k until the collection is made equivalent to the last echo when collection is done by mean of linear reordering, then the direction of collecting echoes for the current excitation is: in a negative direction from the central echo to the space k until the collection is made equivalent to the first echo when collection is done by means of linear reordering; or, when the direction of collecting echoes for the previous excitation is in a negative direction from the central echo to the space k until the collection is made equivalent to the first echo when collection is done by means of linear reordering, then the direction of collecting echoes for the current excitation is: in a positive direction from the central echo to the space k until the collection is made equivalent to the last echo when collection is done by means of linear reordering.

The echo collection module (52) collecting each echo towards the space k in a positive direction or a negative direction from the central echo of the plurality of echoes comprises:

collecting each echo towards the space k in a positive direction or a negative direction from the central echo of the plurality of echoes upon completion of transmission of layer selection encoding gradient pulses and phase encoding gradient pulses of the current excitation.

The flow compensation module (51) performing flow compensation in directions of layered encoding, phase encoding, and frequency encoding for echoes of each excitation comprises:

performing flow compensation in directions of layered encoding and phase encoding for a central echo of each excitation, the central echo being the central echo of a plurality of echoes to be collected when a linear reordering mode is adopted after each excitation;

performing flow compensation in the frequency encoding direction for the odd echoes of each excitation.

Disclosed is a magnetic resonance imaging system, comprising any one of the apparatuses for susceptibility-weighted imaging as described above.

In an aspect of the present disclosure, a plurality of echoes collected for one excitation when the linear reordering mode is adopted are collected by being split into two adjacent excitations when the centric reordering mode is adopted, so that by two adjacent excitations, complete echoes the same as those collected by a single excitation when the linear reordering mode is adopted are collected; in addition, since collection starts from the central echo after each excitation, the impact of the flow effect on an SWI image is reduced; further, since the central echo is collected during each of two adjacent excitations, the SNR of an SWI image is improved.

BRIEF DESCRIPTION OF THE DRAWINGS

Preferred aspects of the present disclosure will be described in detail below with reference to the drawings so that those of ordinary skill in the art will have a better understanding of the above-described and other characteristics and advantages of the present disclosure. In the attached drawings.

Figure 1:
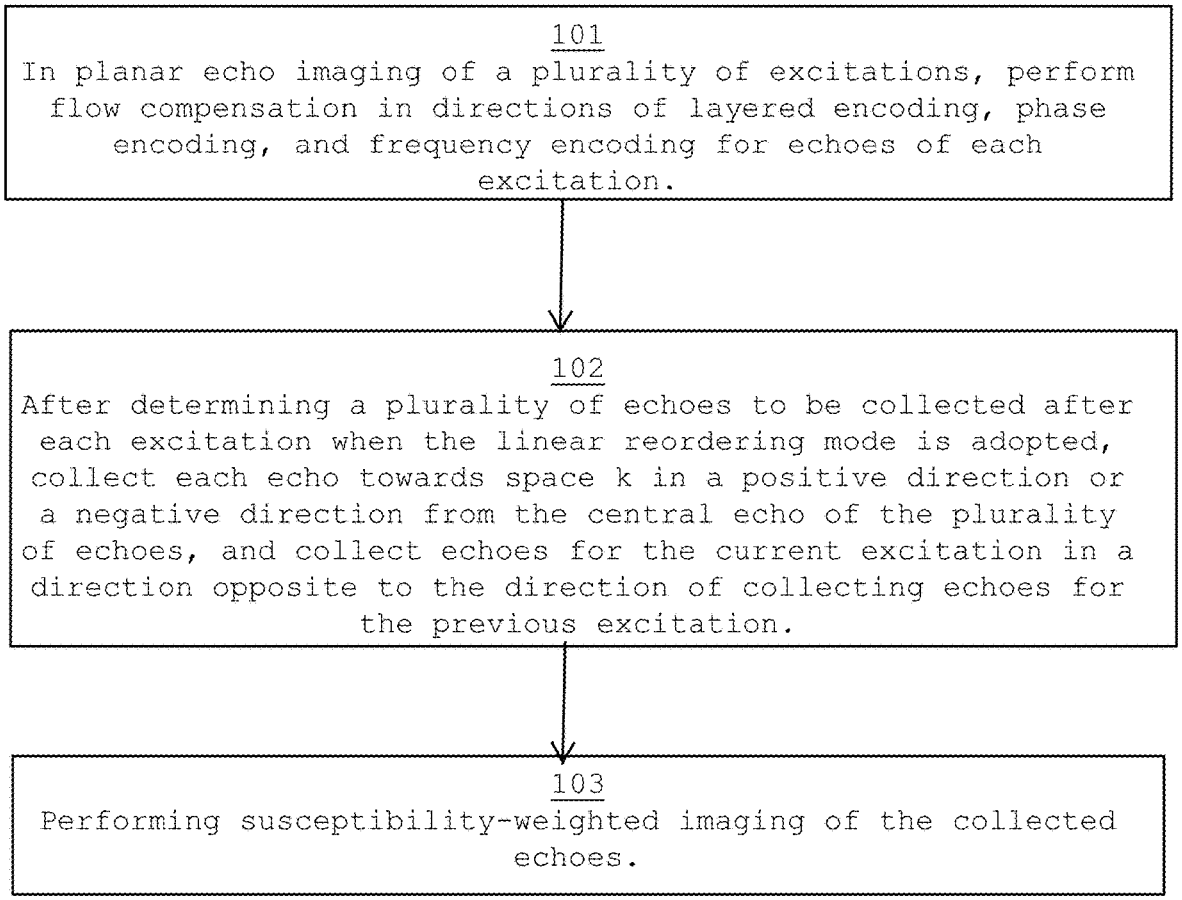
FIG. 1 is a flowchart showing the SWI method provided by an embodiment of the present disclosure.

The meanings of the reference numerals used in the drawings are listed in the following table:

| Reference numeral | Meaning |
| --- | --- |
| 101-103 | Steps |
| 51 | Flow compensation module |
| 52 | Echo collection module |
| 53 | Weighted imaging module |

DETAILED DESCRIPTION

In order to provide a clearer understanding of the objectives, technical schemes, and advantages of the present invention, the present invention will be explained in greater detail below by describing its aspects.

FIG. 1 is a flowchart of the SWI method provided by an aspect of the present disclosure, the method comprising the following steps:

Step 101: In planar echo imaging of a plurality of excitations, perform flow compensation in directions of layered encoding, phase encoding, and frequency encoding for echoes of each excitation.

In one optional aspect, flow compensation is performed in directions of layered encoding and phase encoding for a central echo of each excitation, the central echo being the central echo of a plurality of echoes to be collected when the linear reordering mode is adopted after each excitation; flow compensation is performed in the frequency encoding direction for the odd-numbered (namely, the $1^{st}$, $3^{rd}$, $5^{th}$, $7^{th}$, . . . ) echoes of each excitation.

Flow compensation may be performed in directions of layered encoding and phase encoding according to the following formulas:

$$M_{1,par} = M_{0,par} \Delta t_{par}$$

$$M_{1,phase} = M_{0,phaseprephase} \Delta t_p$$

wherein $M_{1,par}$ is the first-order moment at the central echo in the layered encoding direction, and $M_{1,phase}$ is the first-order moment at the central echo in the phase encoding direction; $M_{0,par}$ is the zero-order moment of the layered encoding gradient in the layered encoding direction, and $M_{0,phaseprephase}$ is the zero-order moment of the prephase gradient in the phase encoding direction, $M_{0,par}$ and $M_{0,phaseprephase}$ varying in different excitations; $\Delta t_{par}$ is the time from the center of the layered encoding gradient to the central echo in the layered encoding direction, and $\Delta t_p$ is the time from the center of the prephase gradient to the central echo in the phase encoding direction. In an aspect of the present disclosure, the first echo in an echo chain is the central echo during collection by means of linear reordering.

Echo collection by means of linear reordering is an existing highly sophisticated technique, which works specifically as follows: after each excitation, a plurality of echoes are collected towards space k in a positive or negative direction to obtain partial data on the space k; data on the space k obtained by a plurality of excitations are combined in an interleaved manner in the Y direction to form complete data on the space k. For example, assume that after each excitation, n echoes (n>1) are collected in the positive direction of the space k, and the number of excitations is m; then, a total of m×n echoes are obtained by the m excitations, and the sequence of the m×n echoes in the positive direction of the Y direction of the space k is as follows:

the $1^{st}$ echo collected in the $1^{st}$ excitation, the $1^{st}$ echo collected in the $2^{nd}$ excitation, the $1^{st}$ echo collected in the $3^{rd}$ excitation, . . . , the $1^{st}$ echo collected in the $(m-1)^{th}$ excitation, the $1^{st}$ echo collected in the $m^{th}$ excitation; the $2^{nd}$ echo collected in the $1^{st}$ excitation, the $2^{nd}$ echo collected in the $2^{nd}$ excitation, the $2^{nd}$ echo collected in the 3rd excitation, . . . , the $2^{nd}$ echo collected in the $(m-1)^{th}$ excitation, the $2^{nd}$ echo collected in the $m^{th}$ excitation; . . . ; the $(n-1)^{th}$ echo collected in the $1^{st}$ excitation, the $(n-1)^{th}$ echo collected in the $2^{nd}$ excitation, the $(n-1)^{th}$ echo collected in the $3^{rd}$ excitation, . . . , the $(n-1)^{th}$ echo collected in the $(m-1)^{th}$ excitation, the $(n-1)^{th}$ echo collected in the $m^{th}$ excitation; the $n^{th}$ echo collected in the $1^{st}$ excitation, the $n^{th}$ echo collected in the $2^{nd}$ excitation, the $n^{th}$ echo collected in the 3rd excitation, . . . , the $n^{th}$ echo collected in the $(m-1)^{th}$ excitation, the $n^{th}$ echo collected in the $m^{th}$ excitation.

In a scheme provided by the present disclosure, which is an improvement on linear reordering, a central echo refers to, assuming that a plurality of echoes are collected by means of linear reordering after each excitation, the central echo of the plurality of echoes. For example, if 9 echoes are collected by means of linear reordering after each excitation, then the $5^{th}$ echo is the central echo.

Step 102: After determining a plurality of echoes to be collected after each excitation when the linear reordering mode is adopted, collect each echo towards space k in a positive direction or a negative direction from the central echo of the plurality of echoes, and collect echoes for the current excitation in a direction opposite to the direction of collecting echoes for the previous excitation.

The collecting echoes for the current excitation in a direction opposite to the direction of collecting echoes for the previous excitation may be either of the following types:

When the direction of collecting echoes of the previous excitation is: in a positive direction from the central echo to the space k until the collection is made equivalent to the last echo when collection is done by means of linear reordering, then the direction of collecting echoes for the current excitation is: in a negative direction from the central echo to the space k until the collection is made equivalent to the first echo when collection is done by means of linear reordering.

When the direction of collecting echoes for the previous excitation is in a negative direction from the central echo to the space k until the collection is made equivalent to the first echo when collection is done by means of linear reordering, then the direction of collecting echoes for the current excitation is: in a positive direction from the central echo to the space k until the collection is made equivalent to the last echo when collection is done by means of linear reordering.

Step 103: performing susceptibility-weighted imaging of the collected echoes.

Since the central echo is collected during each of two adjacent excitations, before susceptibility-weighted imaging, it is possible to superpose and then average the two central echoes of the $m^{th}$ and the $(m+1)^{th}$ collections and then use the obtained average data as the central echo of the $m^{th}$ and the $(m+1)^{th}$ collections, wherein $1 \leq m < M$, M being the total number of excitations of the current planar echo imaging.

In the above-described aspect, a plurality of echoes collected in one excitation when the linear reordering mode is adopted are collected by being split into two adjacent excitations when the centric reordering mode is adopted, so that by two adjacent excitations, complete echoes the same as those collected by a single excitation when the linear reordering mode is adopted are collected; in addition, since collection starts from the central echo after each excitation, the impact of the flow effect on an SWI image is reduced; further, since the central echo is collected during each of two adjacent excitations, the SNR of an SWI image is improved.

In order to further reduce the impact of the flow effect on an SWI image, in a preferred aspect, each echo is collected towards the space k in a positive direction or a negative direction from the central echo upon completion of transmission of layer selection encoding gradient pulses and phase encoding gradient pulses during each excitation. In other words, echo collection starts upon completion of transmission of layer selection encoding gradient pulses and phase encoding gradient pulses.

In an aspect of the present disclosure, the total number of echoes collected when the linear reordering mode is adopted during each excitation (namely, EPI factors) may be restricted to an odd number, and thus the central echo is the echo in the middle. For example, after determining that the number of echoes to be collected after each excitation when the linear reordering mode is adopted is 9, then the central echo is the $5^{th}$ echo. In addition, note that in an aspect of the present disclosure, when echoes are to be collected by means of centric reordering, it is necessary to ensure symmetry of the echo collections for two adjacent excitations; in other words, during two adjacent excitations, it is necessary to, from the central echo, symmetrically collect the same number of echoes in the positive direction and the negative direction of the space k, respectively.

Figure 2:
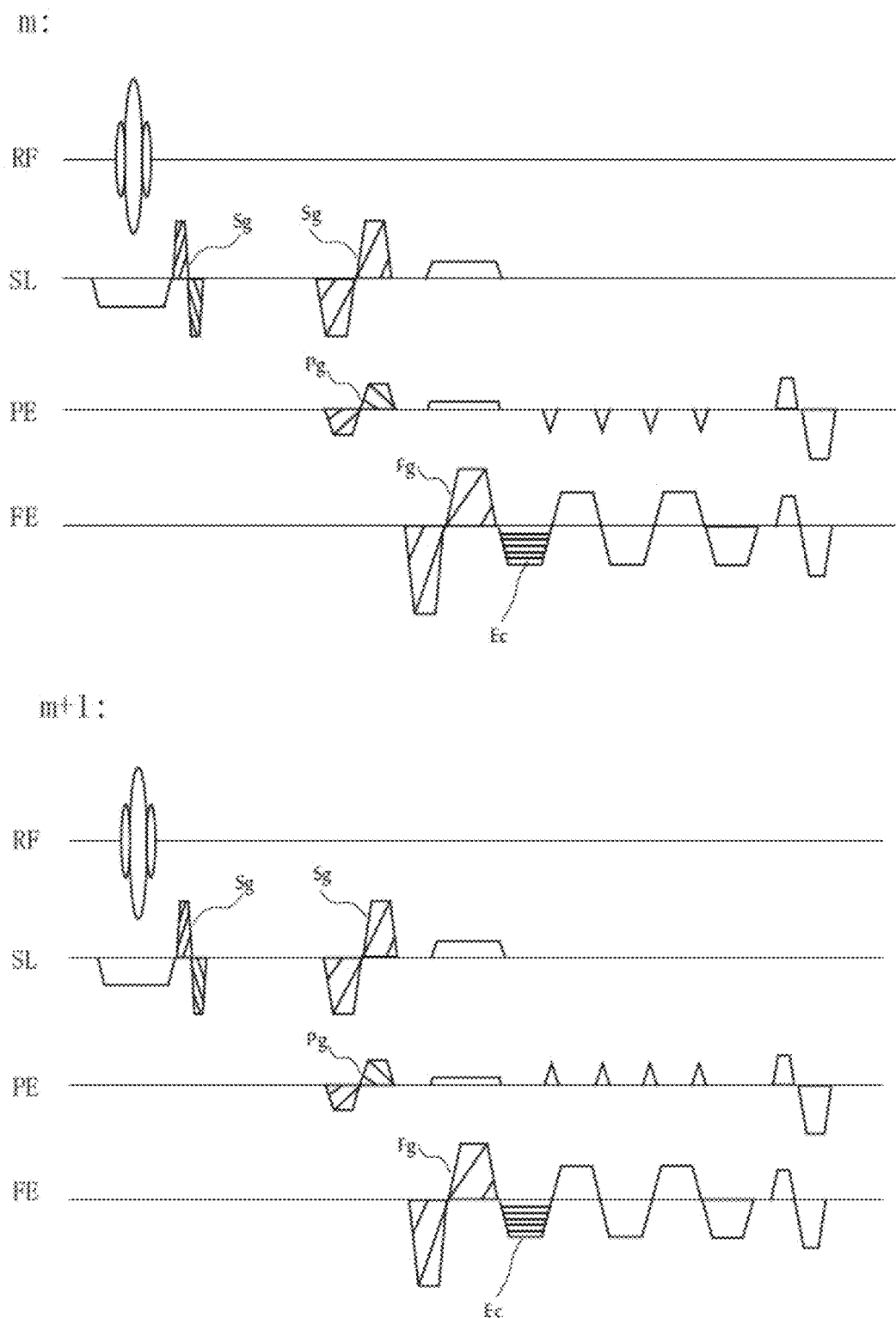
FIG. 2 is a schematic diagram showing the RF and gradient pulse sequences used in two adjacent excitations [the $m^{th}$ and the $(m+1)^{th}$ excitations] in an application example of the present disclosure.

FIG. 2 is a schematic diagram showing the RF and gradient pulse sequences used in two adjacent excitations [the $m^{th}$ and the $(m+1)^{th}$ excitations] in an application example of the present disclosure. It is clear that for each excitation, flow compensation gradients Sg, Pg, and Fg are applied in the PA direction of layered encoding, the PE direction of phase encoding, and the FE direction of frequency encoding. In the present example, if the number of echoes collected during one excitation when the linear reordering mode is adopted is 9, then its central echo EC, namely, the 5th echo, is the first echo to be collected after each excitation in an aspect of the present disclosure.

Figure 3:
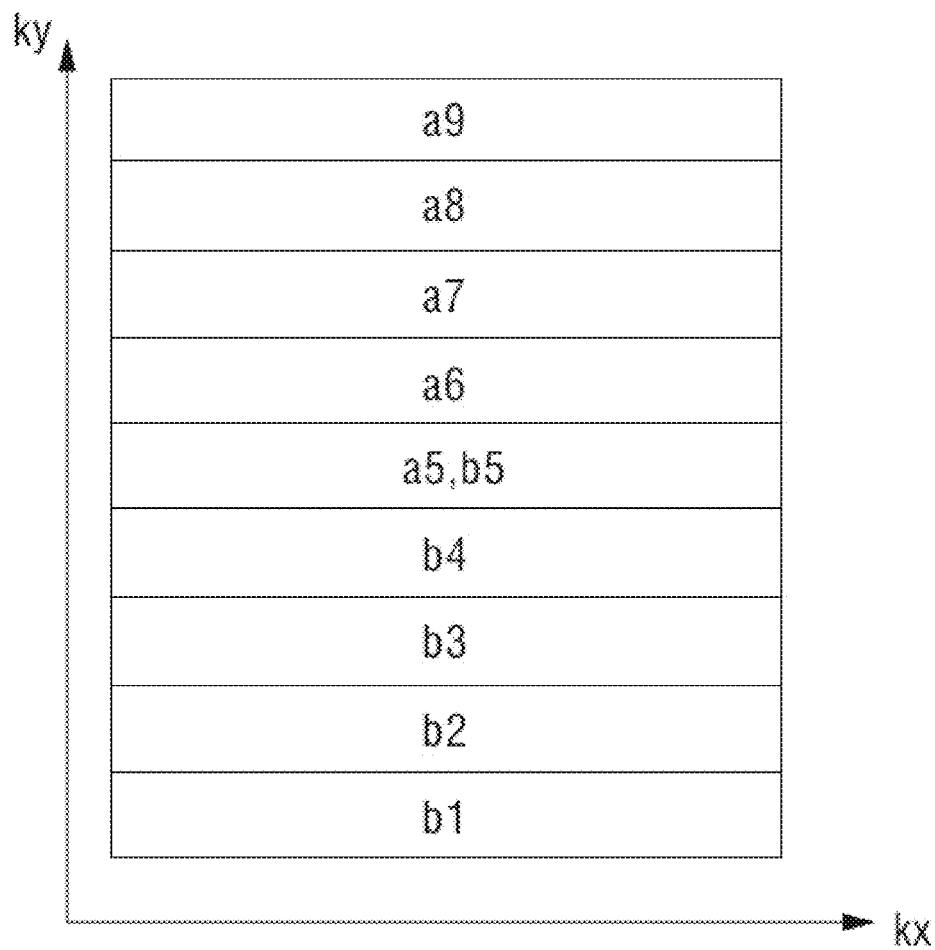
FIG. 3 shows a track of an echo collection process in the space K after excitations using the RF and gradient pulse sequences shown in FIG. 2.

FIG. 3 shows a track of an echo collection process in the space K after excitations using the RF and gradient pulse sequences shown in FIG. 2. As shown in FIG. 3, if 9 echoes are to be collected by means of linear reordering after one excitation, then in an aspect of the present disclosure, after the centric reordering mode is adopted, the echoes will be split for 2 excitations; in other words, in the $m^{th}$ excitation, from the central echo a5, echoes a6, a7, a8, and a9 are collected in turn; in the $(m+1)^{th}$ excitation, from the central echo b5, echoes b4, b3, b2, and b1 are collected in turn.

In order to evaluate the effectiveness of a 3D-iEPI scheme based on the centric reordering in an aspect of the present disclosure in reducing the impact of the flow effect, in an example, using a commercially available 1.5 T scanner equipped with a 20-channel head and neck coil, experiments were conducted on a healthy volunteer by 3D-GRE, 3D-iEPI based on the linear reordering, and a 3D-iEPI scheme based on the centric reordering provided in an aspect of the present disclosure, respectively. The specific imaging parameters are listed in Table 1.

TABLE 1

|  | 3D-GRE | 3D-iEPI based on the linear reordering | 3D-iEPI based on the centric reordering |
| --- | --- | --- | --- |
| Image resolution | 222*320 | 222*320 | 222*320 |
| Field of vision (FOV) (mm) | 187*230 | 187*230 | 187*230 |
| TE (time of echo) | 40 | 40 | 40 |
| TR (time of repetition) | 49 | 80 | 80 |
| Number of layers | 72 | 72 | 72 |
| Layer thickness (mm) | 1.6 | 1.6 | 1.6 |
| Angle of turn | 15 | 25 | 25 |
| Direction of bandwidth reading (Hz/pixels) | 80 | 370 | 370 |
| EPI factor |  | 13 echoes collected in one excitation | 7 echoes collected in one excitation |
| Centric reordering | None | None | Yes |
| Times of calculating an average | None | 2 | 1 |
| Interpolation | Yes | Yes | Yes |
| Concurrent | 2 | None | None |

TABLE 1-continued

| | 3D-GRE | 3D-iEPI based on the linear reordering | 3D-iEPI based on the centric reordering |
|---|---|---|---|
| collection mode in the phase encoding direction | | | |
| Fat suppression | None | Fat saturation | Fat saturation |
| Length of echo collection | 5 minutes and 49 seconds | 2 minutes and 43 seconds | 2 minutes and 43 seconds |

In the 3D-iEPI scheme based on the linear reordering and the 3D-iEPI scheme based on the centric reordering provided by the present disclosure, the TR and the angle of turn were adjusted to match the background contrast in 3D-GRE. After echo data were collected, the 3D-GRE data, the data on 3D-iEPI based on the linear reordering, and the data on 3D-iEPI based on the centric reordering were subjected to standardized SWI processing.

Figure 4:
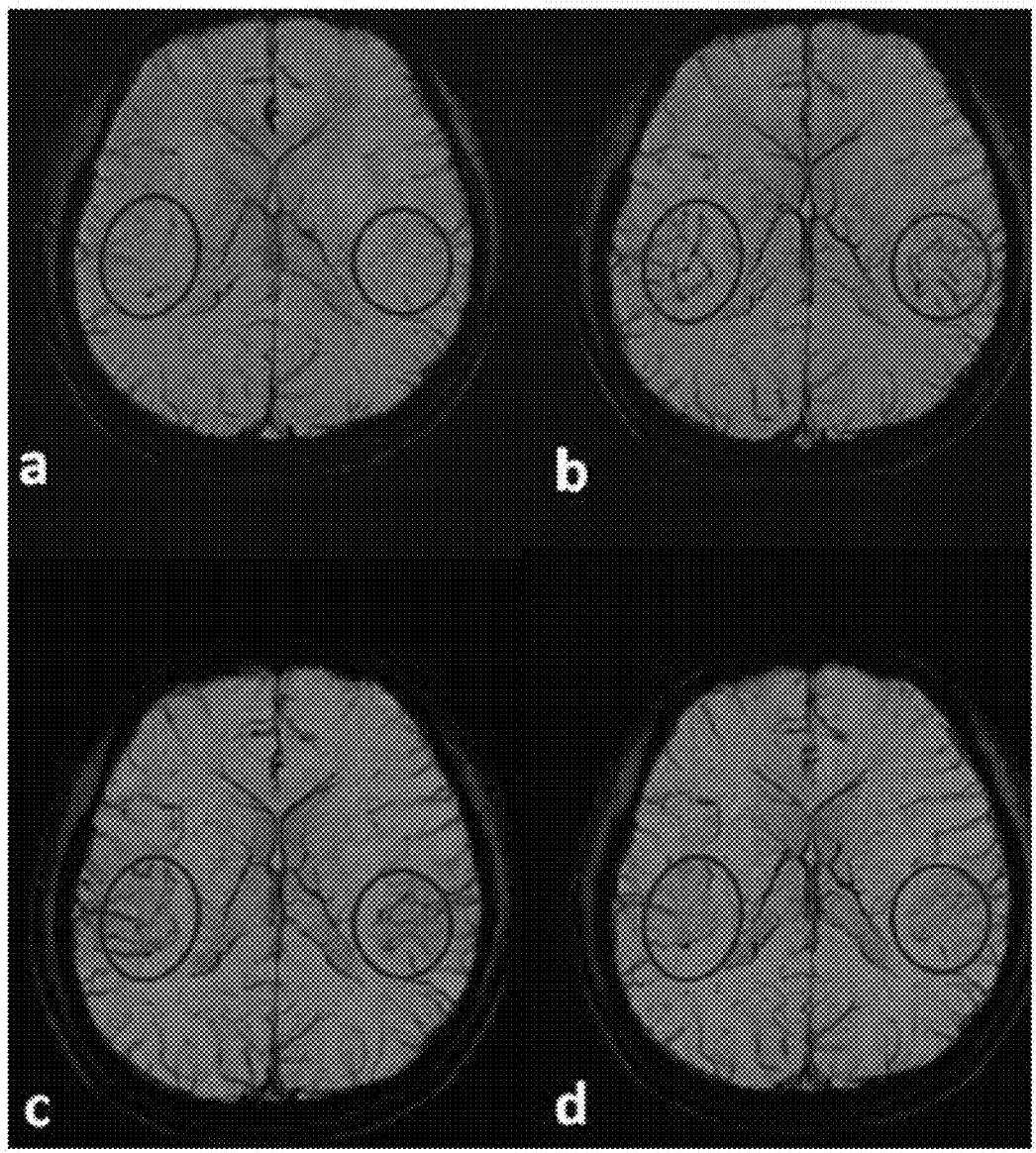
FIG. 4 is a schematic diagram comparing mIP images processed by SWI using 3D-GRE, 3D-iEPI based on linear reordering, and 3D-iEPI based on centric reordering, respectively.

FIG. 4 shows a schematic diagram comparing mIP images processed by SWI using 3D-GRE, 3D-iEPI based on the linear reordering, and 3D-iEPI based on the centric reordering, respectively. In the figure, a corresponds to the 3D-GRE scheme with flow compensation, b corresponds to the 3D-GRE scheme without flow compensation, c corresponds to the 3D-iEPI scheme with flow compensation and linear reordering, and d corresponds to the 3D-iEPI scheme with flow compensation and centric reordering.

From the sub-images a, b, c, and d shown in FIG. 4, it is clear that:

Compared with image b, which was not flow-compensated, images a, c, and d, which were flow-compensated, had improved image quality, representing blood vessels clearly; in addition, images a, c, and d had similar image quality;

A comparison of image d with images a and c showed that image d, for which centric reordering was adopted, had reduced vein contaminations caused by blood flows so that blood vessels were represented more clearly;

In addition, the images for which 3D-iEPI was adopted (images c and d) showed more small vessels, possible because of an increase in TE of high-frequency signals.

In summary, compared with the traditional 3D-GRE scheme, the 3D-iEPI scheme based on the centric reordering provided by an aspect of the present disclosure allows the scan time to be reduced roughly by half, while achieving imaging quality equivalent to that achieved by the traditional 3D-GRE scheme. In addition, compared with the 3D-iEPI scheme based on the linear reordering, the 3D-iEPI scheme based on the centric reordering provided by an aspect of the present disclosure achieves image quality of a further reduction in vein contaminations caused by blood flows so that blood vessels are represented more clearly.

Figure 5:
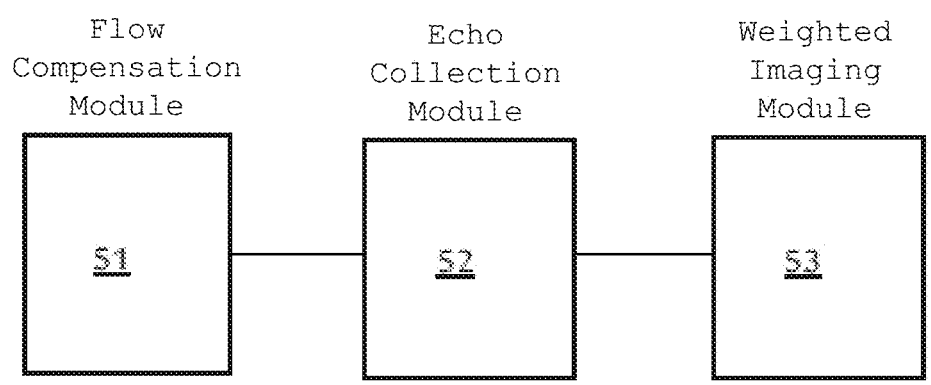
FIG. 5 is a structural diagram of the SWI apparatus provided by an embodiment of the present disclosure.

FIG. 5 shows a structural diagram of an apparatus for susceptibility-weighted imaging provided by an aspect of the present disclosure, the apparatus comprising:

a flow compensation module 51 for, in planar echo imaging of a plurality of excitations, performing flow compensation in directions of layered encoding, phase encoding, and frequency encoding for echoes of each excitation;

an echo collection module 52 for, after determining a plurality of echoes to be collected after each excitation when the linear reordering mode is adopted, collecting each echo towards the space k in a positive direction or a negative direction from the central echo of the plurality of echoes, and collecting echoes for the current excitation in a direction opposite to the direction of collecting echoes for the previous excitation;

a weighted imaging module 53 for performing susceptibility-weighted imaging of the collected echoes.

In an optional aspect, the echo collection module 52 collecting echoes for the current excitation in a direction opposite to the direction of collecting echoes for the previous excitation comprises: when the direction of collecting echoes for the previous excitation is in a positive direction from the central echo to the space k until the collection is made equivalent to the last echo when collection is done by means of linear reordering, then the direction of collecting echoes for the current excitation is: in a negative direction from the central echo to the space k until the collection is made equivalent to the first echo when collection is done by means of linear reordering; or, when the direction of collecting echoes for the previous excitation is in a negative direction from the central echo to the space k until the collection is made equivalent to the first echo when collection is done by means of linear reordering, then the direction of collecting echoes for the current excitation is: in a positive direction from the central echo to the space k until the collection is made equivalent to the last echo when collection is done by means of linear reordering.

In an optional aspect, the echo collection module 52 collecting each echo towards the space k in a positive direction or a negative direction from the central echo of the plurality of echoes comprises: collecting each echo towards the space k in a positive direction or a negative direction from the central echo of the plurality of echoes upon completion of transmission of layer selection encoding gradient pulses and phase encoding gradient pulses of the current excitation.

In an optional aspect, the flow compensation module 51 performing flow compensation in directions of layered encoding, phase encoding, and frequency encoding for echoes of each excitation comprises: performing flow compensation in directions of layered encoding and phase encoding for a central echo of each excitation, the central echo being the central echo of a plurality of echoes to be collected after each excitation when the linear reordering mode is adopted; performing flow compensation in the frequency encoding direction for the odd-numbered echoes of each excitation.

An aspect of the present disclosure proposes a susceptibility-weighted imaging system, comprising the above-described fast susceptibility-weighted imaging apparatus.

In summary, an aspect of the present disclosure has the following beneficial technical effects:

Compared with an existing SWI sequence, a high-efficiency echo collection scheme is adopted to greatly shorten the echo collection time;

Compared with a fully flow-compensated EPI sequence that adopts flyback, an aspect of the present disclosure, because of a relatively short echo interval, can maintain a high scanning efficiency and a low degree of distortion;

Compared with a flow-compensated EPI sequence adopting linear reordering, an aspect of the present disclosure can further reduce contamination signals from arterial flows in an SWI image;

In opposing phase encoding directions, partial echoes are obtained by sampling in the positive direction and negative direction of space k in two consecutive excitations, respectively; this establishes the feasibility of distortion correction by a standard reverse gradient method, allowing more flexible selection of an echo sequence length.

It should be noted that although partially flow-compensated 3D-iEPI with a centric reordering scheme in a solution provided by the present disclosure allows better suppression of arterial signals, a centric reordering scheme, different from a linear reordering scheme, adopts the same EPI factor; echoes collected during one excitation when the linear reordering mode is adopted are split for collection in two excitations when the centric reordering mode is adopted in an aspect of the present disclosure; since the number of echoes obtained during each excitation is relatively small, the SNR is inevitably low. However, collection by the centric reordering and sampling twice the central echo allows a reduction of the flow effect while improving the SNR. In addition, collecting partial echoes twice consecutively allows the motion impact to be minimized and facilitates subsequent data joining. Finally, the experiment results showed that since the used echo sequence was relatively short, the distortions and blur artifacts in the SWI images obtained by a scheme of the present disclosure were not obvious.

The above-described aspect is only a preferred aspect of the present disclosure and is not intended to limit the scope of the present disclosure. Any modifications, equivalent substitutions, and improvements made without departing from the spirit or principle of the present disclosure shall fall within the protection scope of the present disclosure.

What is claimed is:

1. A method for susceptibility-weighted imaging performed by a magnetic resonance imaging (MRI) system having a flow compensator, an echo collector, and a weighted imager, the method comprising:
   in planar echo imaging of a plurality of excitations, the flow compensator of the MRI system performing flow compensation in directions of layered encoding, phase encoding, and frequency encoding for echoes of each excitation;
   the echo collector of the MRI system determining a plurality of echoes to be collected when a linear reordering mode is adopted after each excitation, and collecting each echo in a positive direction or a negative direction from a central echo of the plurality of echoes toward space k, wherein a direction of collecting echoes for the current excitation is opposite to a direction of collecting echoes for the previous excitation; and
   the weighted imager of the MRI system performing susceptibility-weighted imaging of the collected echoes to generate susceptibility-weighted images for display.

2. An apparatus for susceptibility-weighted imaging in a magnetic resonance imaging system, the apparatus comprising:
   a flow compensator configured to, in planar echo imaging of a plurality of excitations, perform flow compensation in directions of layered encoding, phase encoding, and frequency encoding for echoes of each excitation;
   an echo collector configured to, after determining a plurality of echoes to be collected after each excitation when a linear reordering mode is adopted, collect each echo towards space k in a positive direction or a negative direction from the central echo of the plurality of echoes, and collect echoes for the current excitation in a direction opposite to the direction of collecting echoes for the previous excitation; and
   a weighted imager configured to perform susceptibility-weighted imaging of the collected echoes to generate susceptibility-weighted images for display.

3. A method for susceptibility-weighted imaging performed by a magnetic resonance imaging (MRI) system, the method comprising:
   in planar echo imaging of a plurality of excitations, a computer of the MRI system performing flow compensation in directions of layered encoding, phase encoding, and frequency encoding for echoes of each excitation;
   the computer of the MRI system determining a plurality of echoes to be collected when a linear reordering mode is adopted after each excitation, and collecting each echo in a positive direction or a negative direction from a central echo of the plurality of echoes toward space k, wherein a direction of collecting echoes for the current excitation is opposite to a direction of collecting echoes for the previous excitation; and
   the computer of the MRI system performing susceptibility-weighted imaging of the collected echoes to generate susceptibility-weighted images for display.

4. The method as claimed in claim 1, wherein the direction of collecting echoes of the current excitation being opposite to the direction of collecting echoes of the previous excitation comprises:
   when the direction of collecting echoes for the previous excitation is for the previous excitation is in a positive direction from the central echo toward the space k until the collection of echoes is made equivalent to the last echo when collection is done by mean of linear reordering, then the direction of collecting echoes for the current excitation is in a negative direction from the central echo toward the space k until the collection of echoes is made equivalent to the first echo when collection is done by mean of linear reordering; or
   when the direction of collecting echoes for the previous excitation is in a negative direction from the central echo toward the space k until the collection of echoes is made equivalent to the first echo when collection is done in the linear reordering, then the direction of collecting echoes for the current excitation is in a positive direction from the central echo toward the space k until the collection of echoes is made equivalent to the last echo when collection is done by mean of linear reordering.

5. The method as claimed in claim 1, wherein said collecting each echo in a positive direction or a negative direction from the central echo of the plurality of echoes toward the space k comprises:
   collecting each echo towards the space k in a positive direction or a negative direction from the central echo of the plurality of echoes upon completion of transmission of layer selection encoding gradient pulses and phase encoding gradient pulses of the current excitation.

6. The method as claimed in claim 1, wherein, after said collecting each echo towards the space k in a positive direction or a negative direction from the central echo of the plurality of echoes and before performing susceptibility-weighted imaging of the collected echoes, the method further comprises:
   superposing and then averaging the two central echoes of the $m^{th}$ and the $(m+1)^{th}$ collections and then using the obtained average data as the central echo of the $m^{th}$ and the $(m+1)^{th}$ collections, wherein $1 \leq m < M$, M being the total number of excitations of the current planar echo imaging.

7. The method as claimed in claim 1, wherein said performing flow compensation in directions of layered encoding, phase encoding, and frequency encoding for echoes of each excitation comprises:
- performing flow compensation in directions of layered encoding and phase encoding for a central echo of each excitation, the central echo being the central echo of the plurality of echoes to be collected when the linear reordering mode is adopted after each excitation; and
- performing flow compensation in the frequency encoding direction for an odd-numbered echo of each excitation.

8. The method as claimed in claim 7, wherein said performing flow compensation in directions of layered encoding and phase encoding for a central echo of each excitation comprises:
- performing flow compensation in directions of layered encoding and phase encoding according to the following formulas:

$$M_{1,par}=M_{0,par}\Delta t_{par}, \text{ and}$$

$$M_{1,phase}=M_{0,phaseprephase}\Delta t_p,$$

wherein $M_{1,par}$ is a first-order moment at the central echo in the layered encoding direction, and $M_{1,phase}$ is a first-order moment at the central echo in the phase encoding direction; $M_{0,par}$ is the zero-order moment of the layered encoding gradient in the layered encoding direction, and $M_{0,phaseprephase}$ is the zero-order moment of the prephase gradient in the phase encoding direction, $M_{0,par}$ and $M_{0,phaseprephase}$ varying in different excitations; $\Delta t_{par}$ is the time from the center of the layered encoding gradient to the central echo in the layered encoding direction, and $\Delta t_p$ is the time from the center of the prephase gradient to the central echo in the phase encoding direction.

9. The apparatus as claimed in claim 2, wherein said echo collector configured to collect echoes for the current excitation in a direction opposite to the direction of collecting echoes of the previous excitation comprises:
- when the direction of collecting echoes of the previous excitation is in a positive direction from the central echo to the space k until the collection is made equivalent to the last echo when collection is done by mean of linear reordering, then the direction of collecting echoes for the current excitation is in a negative direction from the central echo to the space k until the collection is made equivalent to the first echo when collection is done by mean of linear reordering; or
- when the direction of collecting echoes of the previous excitation is in a negative direction from the central echo to the space k until the collection is made equivalent to the first echo when collection is done by mean of linear reordering, the direction of collecting echoes for the current excitation is in a positive direction from the central echo to the space k until the collection is made equivalent to the last echo when collection is done by mean of linear reordering.

10. The apparatus as claimed in claim 2, wherein said echo collector configured to collect each echo towards the space k in a positive direction or a negative direction from the central echo of the plurality of echoes comprises:
- collecting each echo towards the space k in a positive direction or a negative direction from the central echo of the plurality of echoes upon completion of transmission of layer selection encoding gradient pulses and phase encoding gradient pulses for the current excitation.

11. The apparatus as claimed in claim 2, wherein said flow compensator configured to perform flow compensation in directions of layered encoding, phase encoding, and frequency encoding for echoes of each excitation is configured to:
- perform flow compensation in directions of layered encoding and phase encoding for a central echo of each excitation, the central echo being the central echo of the plurality of echoes to be collected when the linear reordering mode is adopted after each excitation; and
- perform flow compensation in the frequency encoding direction for an odd-numbered echo of each excitation.

12. The magnetic resonance imaging system, comprising the apparatus for susceptibility-weighted imaging as claimed in claim 2.

13. The apparatus as claimed in claim 2, wherein the flow compensator is a flow compensation processing module, the echo collector is an echo collection processing module, and the weighted imager is a weighted imaging processing module.

* * * * *